Oct. 27, 1959 S. R. MEADOWS 2,909,934

TELEVISION TUNER

Filed Feb. 13, 1956 2 Sheets-Sheet 1

INVENTOR.
Stanley R. Meadows.
BY
Mason, Kolehmainen, Rathburn and Wyss.
Attorneys.

Oct. 27, 1959 S. R. MEADOWS 2,909,934

TELEVISION TUNER

Filed Feb. 13, 1956 2 Sheets-Sheet 2

INVENTOR.
Stanley R. Meadows.
BY
Mason, Kolehmainen, Rathburn and Wyss.
Attorneys.

United States Patent Office 2,909,934

Patented Oct. 27, 1959

2,909,934

TELEVISION TUNER

Stanley R. Meadows, Bloomington, Ind., assignor to Sarkes Tarzian, Inc., Bloomington, Ind., a corporation of Indiana Application February 13, 1956, Serial No. 565,070

10 Claims. (Cl. 74—10.45)

The present invention relates to television tuners, and, more particularly, to the provision of a new and improved television tuner which is adapted selectively to receive signals from any one of the television channels in a predetermined television band. Moreover, the present invention relates to a television tuner wherein a safety feature is incorporated to prevent damage to the tuner when an attempt is made to rotate the channel selector knob thereof beyond the ends of the television band.

Many present day television receivers are manufactured to receive signals from any one of the television channels in either of the VHF and UHF television bands and it has been conventional to provide concentric VHF and UHF channel selector knobs. In the UHF tuner the UHF channel selector knob is connected to the main tuning shaft which is usually provided with stops to limit rotation of the main tuning shaft to approximately one hundred and eighty degrees when ganged tuning condensors are employed. In such tuners it is possible to damage the tuner by exerting excessive force on the UHF channel selector knob when the main tuning shaft is against the stop. This situation is complicated by the fact that most set owners are accustomed to using a VHF tuner in which the outer concentric knob is used for fine tuning and is continuously rotatable. If the outer concentric knob is used as a UHF channel selector knob in a combined VHF-UHF tuner, the operator may readily exert excessive force on this knob since he is accustomed to a continuously rotatable outer knob in VHF television receivers. Accordingly, it is an object of the present invention to provide a new and improved television tuner wherein facilities are provided for preventing excessive force from being applied to the main tuning shaft of the tuner through the channel selector knob thereof.

It is another object of the present invention to provide a new and improved UHF tuner having a UHF channel selector knob which is effectively disconnected from the main tuning shaft of the UHF tuner at either limit of travel thereof so that the UHF channel selector knob may be rotated continuously without damage to the tuner.

It is a further object of the present invention to provide a UHF tuner wherein the UHF channel selector knob may be rotated in opposite directions to effect coarse and fine UHF tuning over the entire UHF television band and which is also continuously rotatable beyond either end of the UHF television band.

A still further object of the present invention is to provide a new and improved UHF tuner having a UHF channel selector knob which is effectively disconnected from the main tuning shaft of the tuner at either limit of travel thereof and wherein means are provided for indicating to the operator when such limits have been reached.

The invention, both as to its organization and method of operation, together with further objects and advantages thereof, will best be understood by reference to the following specification, taken in connection with the accompanying drawings in which.

Figure 1:
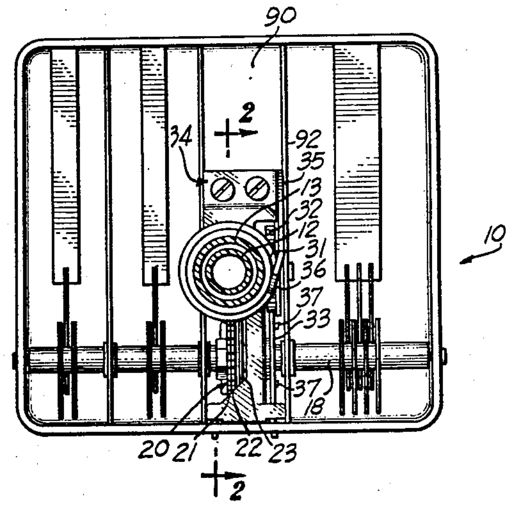
Fig. 1 is an elevational view, partly in section, of a television tuner embodying the principles of the present invention.
Figure 2:
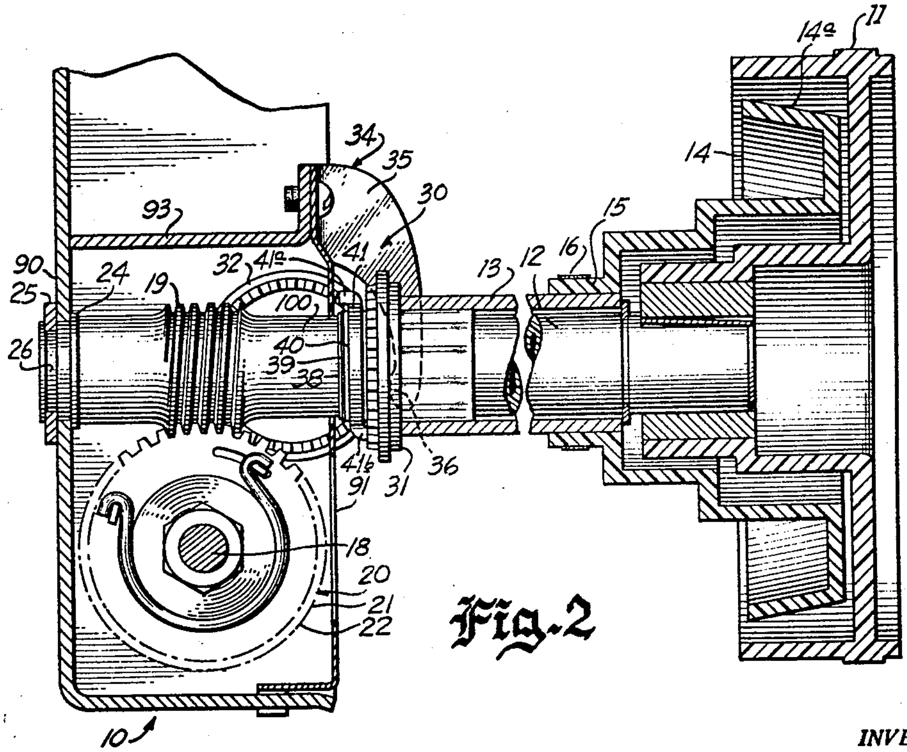
Fig. 2 is an enlarged sectional view taken along the line 2—2 of Fig. 1.

Referring now to the drawings, and more particularly to Figs. 1 and 2 thereof, the UHF tuner of the present invention is therein illustrated at 10. The UHF tuner 10 is generally similar to the UHF portion of the combined VHF–UHF tuner described in a copending application of Stanley R. Meadows, Chalmers Lewis and Carl E. Pearson, Serial No. 463,416, filed on October 20, 1954, which is assigned to the same assignee as the present application, and includes a UHF channel selector knob 11, which is selectively rotatable to provide both coarse and fine UHF station selection or tuning to any desired UHF station. The knob 11 is connected to a hollow channel selector shaft 12 adapted to receive therein the station selecting and vernier tuning shafts of the VHF tuner (not shown), as described in detail in the above identified copending application, and the shaft 12 is interconnected, by means of a gearing arrangement to be described in more detail hereinafter, to a concentric hollow sleeve 13 disposed about the shaft 12 in telescoping relation thereto. The hollow sleeve 13 carries at the outer end thereof a UHF indicator dial 14, as best shown in Fig. 2, and the shafts 12 and 13 are also connected by means of a gearing mechanism to be described hereinafter to the main tuning shaft 18 of the tuner 10.

In order to provide for rotation of the indicator dial 14 with the hollow shaft 13, suitable frictional clamping means are utilized, such as a spring band 16 tightened about the hub 15. In order to permit viewing of the UHF television channel numbers printed or otherwise suitably inscribed on the outer surface 14a of the UHF indicator dial 14, the UHF channel selector knob 11 is provided with a transparent flange portion 17.

As best shown in Figs. 1 and 2, rotation of the UHF channel selector knob 11 and associated shaft 12 effect rotation of the main tuning shaft 18 which lies in a plane perpendicularly disposed with respect to the shaft 12. In order to transmit the rotary movement of the shaft 12 to the perpendicularly related main tuning shaft 18, there is employed a worm wheel assembly comprising a worm element 19 press fitted on the end of the channel selector shaft 12 and a worm wheel 20 cooperatively disposed relative to the worm element 19 and mounted on the main tuning shaft 18 for rotation therewith. More particularly, the worm element 19 is suitably journaled in the housing 90 of the tuner 10 and a bracket 91 supported from the housing 90. Furthermore, the worm element 19 (and hence the channel selector shaft 12) is maintained in fixed horizontal position relative to the housing by an annular lip 24 cooperatively associated with a retaining ring 25 adapted to be seated in the annular groove 26 of the worm element 19. The worm wheel 20 comprises a pair of antibacklash gears 21 and 22, the latter of which is operatively associated with a friction clutch 23, described in more detail in the above identified copending application, which are mounted on the main tuning shaft 18 so that the drive through the worm assembly effects a fine tuning operation on the main tuning shaft 18 by producing a speed reduction ratio of approximately 40 to 1.

In order to drive the main tuning shaft 18 in substantially direct ratio from the channel selector shaft 12 to effect coarse UHF station selection or tuning, there is provided a gearing arrangement, which includes a crown gear 31 splined on the inner rearward surface of the sleeve 13 in cooperative relation with a spur gear 32 which is rotatably mounted on a partition 92 of the housing 90. The gear 32 is further disposed in cooperative relation with another spur gear 33 fixedly mounted on the main tuning shaft 18. A bracket 34, which is supported on a housing partition 93, is provided with a flange 35 having an arm portion 36 adapted to engage the back of the crown gear 31 so as to maintain the gear 31 in engagement with the gear 32.

In order to provide for limited rotation of the main tuning shaft 18 whereby the shaft 18 is prevented from rotating beyond positions corresponding to the upper and lower ends of the UHF television band, there is provided a limit stop **92*a* projecting from the partition 92 and adapted to cooperate with a pair of protruding lugs 37 (Fig. 1) stamped out of the side of the gear 33, as described in greater detail in the above identified copending application. Whenever the lugs 37 are moved against the stops the main tuning shaft 18** is restrained from further rotation in the same direction.

Figures 3, 4, 5, 6, 7:
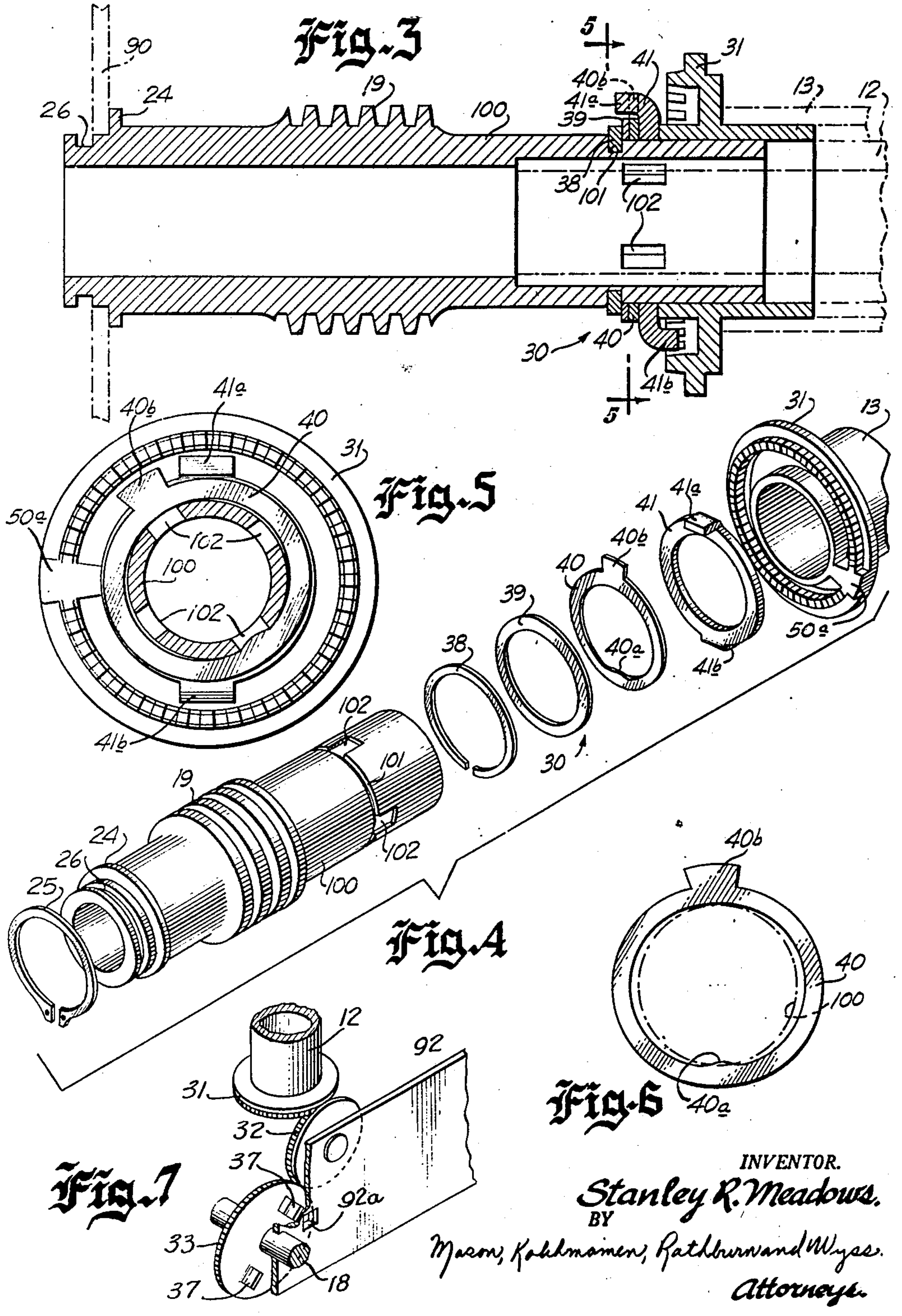
Fig. 3 is a further enlarged fragmentary sectional view taken along the line 2—2 of Fig. 1.
Fig. 4 is an exploded perspective view of an extension of the channel selector shaft and drive mechanism of the tuner of Fig. 1.
Fig. 5 is a sectional view taken along the line 5—5 of Fig. 3.
Fig. 6 is an elevational view of a releasable coupling ring employed in the tuner of Fig. 1.
Fig. 7 is a perspective view of a gearing arrangement and limit means of the tuner of Fig. 1.

In order to provide a tuning arrangement wherein both high speed and low speed tuning are available so that the UHF band may be covered rapidly during coarse tuning while permitting immediately thereafter a fine or vernier tuning to the desired UHF station, there is provided, in addition to the above described worm wheel assembly and gearing arrangement, a drive mechanism 30, best shown in Figs. 3 and 4. More particularly, the drive mechanism 30 includes a portion of the worm element 19 defined as a forwardly extending hub 100 splined to the outer rearward surface of the channel selector shaft 12, thereby forming a rearward integral extension thereof. The hub 100 is provided with a groove 101 for receiving a retaining ring 38 which functions to hold the parts of the drive mechanism 30 in cooperative relationship. A brass washer 39 is positioned on the hub 100 adjacent the ring 38 and the hub 100 is provided with a plurality of apertures 102 therein, any one of which is adapted to receive an inwardly extending lug portion **40*a* of a coupling ring 40 which is also positioned on the hub 100 adjacent the washer 39. The coupling ring 40 is provided with an outwardly extending drive lug portion 40*b* which is adapted to engage a rearwardly projecting lug 41*a* of a lost motion or floating washer 41 which is also positioned on the hub 100 adjacent the coupling ring 40. The floating washer 41 is provided with a forwardly projecting lug portion 41*b* which is adapted to engage either side of a lug 50*a* formed on the crown gear 31, it being understood that the crown gear 31 is fixedly secured to the inner end of the indicator shaft 13**.

With the above described drive mechanism 30, rotation of the channel selector knob 11 in either direction effects a fine tuning of the main tuning shaft 18 through the drive shaft 12 and the worm wheel assembly. As the hub 100 of the worm 19 is rotated, the coupling ring 40 is also rotated since the lug portion **40*a* thereof is normally positioned within one of the apertures 102 in the hub 100. As the coupling ring 40 is rotated the drive lug 40*b* thereof picks up the lug 41*a* on the floating washer 41 and upon further rotation of the ring 40 the lug 41*b* of the floating washer 41 engages the lug 50*a* on the crown gear 31. Further rotation of the ring 40 in the same direction thus effects a direct drive connection to the main tuning shaft 18 through the spur gears 32 and 33. It will therefore be appreciated that reverse rotation of the selector knob 11, after a coarse tuning connection has been established, will provide a fine tuning adjustment of the shaft 18 for approximately two revolutions of the knob 11 by virtue of the lost motion action of the floating washer 41 of the drive mechanism in cooperation with both the crown gear 31 and the coupling ring 40**.

In accordance with a feature of the present invention, the coupling ring 40 is arranged to permit continuous rotation of the channel selector shaft 12 while effectively disengaging the main tuning shaft 18 therefrom when the shaft 18 has been rotated to either end of its effective tuning range. More particularly, the coupling ring 40 has a somewhat elliptical body with the minimum diameter thereof between the lug portions **40*a* and 40*b*, as best illustrated in Fig. 6. Accordingly, when the shaft 18 has been rotated to either end of its effective tuning range, i.e., when one of the lugs 37 is moved against the limit stop 92*a* and the crown gear 31 is thus prevented from further movement in the same direction, further force exerted on the hub 100 will cause the lug portion 40*a* of the coupling ring 40 to be forced out of the particular aperture 102 in which it was previously positioned with the result that the drive mechanism 30 is effectively disengaged from the crown gear 31 and the tuning shaft 18. The lug portion 40*a* then rides on the surface of the hub 100 until the next aperture 102 is encountered, at which time the drive ring snaps into the aperture 102 with an audible click or like sharp noise. If the hub is urged still further in the same direction, the lug 40*a* is successively forced out of the apertures 102 so as to maintain the tuning shaft 18 effectively disengaged from the knob 11 while at the same time giving a series of audible clicks which indicate to the operator that the knob 11 is being forced in a direction away from the end of the UHF television band. Manifestly, the coupling ring 40, but particularly the inwardly extending drive lug 40*a*, and the plurality of apertures 102 of the hub 100 (splined to the channel selector shaft 12) comprise cooperating detent means for interconnecting the channel selector shaft 12 and the main tuning shaft 18 through the gearing described above. During rotation of the knob 11, described immediately above, the worm 19 is prevented from jamming by virtue of the friction clutch 23 which slips when either lug 37 is moved against the stop 92*a* and hence effectively disengages the worm wheel assembly 19 and gears 21 and 22 from the shaft 18. However, as soon as the operator becomes aware of the above described situation and reverses the direction of rotation of the knob 11, the shaft 18 is again driven by the worm 19 through the friction clutch 23. Also, the lug 40*a* is again seated in one of the apertures 102 and after approximately two revolutions of the knob 11 the lug 50*a* on the crown gear 31 is picked up and a direct drive in the opposite direction is established between the tuning shaft 18 and the knob 11**.

While there has been described what is at present considered to be the preferred embodiment of the invention, it will be understood that various modifications may be made therein which are in the true spirit and scope of the invention as defined in the appended claims.

What is claimed as new and desired to be secured by Letters Patent of the United States is:

1. In a television tuner, a channel selector shaft, a main tuning shaft movable between two fixed positions gearing means for establishing a direct driving connection between said channel selector shaft and said main tuning shaft, and releasable jaw clutch means included in said gearing means for effecting engagement of said main tuning shaft and said channel selector shaft in a plurality of selective relative positions and for disengaging said main tuning shaft from said channel selector shaft upon movement of said main tuning shaft to either of said fixed positions, said clutch means including a lost motion connecting means for permitting operation of said channel selector shaft independently of said gearing means for establishing said direct driving connection.

2. In a television tuner, a channel selector shaft, a main tuning shaft movable between two fixed positions, means for establishing a direct driving connection between said channel selector shaft and said main tuning shaft, means included in said last named means for disengaging said main tuning shaft from said channel selector shaft upon movement of said main tuning shaft to either of said fixed positions, and means for audibly indicating disengagement of said main tuning shaft from said channel selector shaft.

3. In a television tuner, a hollow channel selector shaft, a main tuning shaft movable between two fixed positions, speed reduction means including a worm and a worm wheel for driving said main tuning shaft from said channel selector shaft, means independent of said speed reduction means for driving said main tuning shaft at substantially direct ratio from said channel selector shaft, and means included in said last named means for effectively disengaging said main tuning shaft from said channel selector shaft upon movement of said main tuning shaft to either of said fixed positions.

4. In a television tuner, a hollow channel selector shaft, a main tuning shaft movable between two fixed positions, speed reduction means for driving said main tuning shaft from said channel selector shaft, means independent of said speed reduction means for driving said main tuning shaft at substantially direct ratio from said channel selector shaft, said last named means including a releasable coupling ring for disengaging said main tuning shaft from said channel selector shaft upon movement of said main tuning shaft to either of said fixed positions.

5. In a television tuner, a hollow channel selector shaft, a main tuning shaft movable between two fixed positions, speed reduction means for driving said main tuning shaft from said channel selector shaft, means including gear means independent of said speed reduction means for driving said main tuning shaft at substantially direct ratio from said channel selector shaft, and means including cooperating detent means interconnecting said channel selector shaft and said gear means for effectively disengaging said main tuning shaft from said channel selector shaft upon movement of said main tuning shaft to either of said fixed positions.

6. In a television tuner, a hollow channel selector shaft, a main tuning shaft movable between two fixed positions, speed reduction means including a worm and a worm wheel for driving said main tuning shaft from said channel selector shaft, a crown gear mounted on a sleeve rotatably carried by the said selector shaft, means including said crown gear for driving said main tuning shaft at substantially direct ratio from said channel selector shaft, and means including releasable detent means interconnecting said channel selector shaft and said crown gear for effectively disengaging said main tuning shaft from said channel selector shaft upon movement of said main tuning shaft to either of said fixed positions.

7. In a television tuner, a hollow channel selector shaft, a main tuning shaft movable between two fixed positions, speed reduction means including a worm and a worm wheel for driving said main tuning shaft from said channel selector shaft, a crown gear mounted on a sleeve rotatably carried by said selector shaft, means including said crown gear for driving said main tuning shaft at substantially direct ratio from said channel selector shaft, said last named means including a coupling ring rotatably mounted on said channel selector shaft and adapted to transmit torque from said channel selector shaft to said crown gear, said coupling ring also being adapted to disengage said crown gear from said channel selector shaft when a predetermined torque is exerted thereon, thereby to disengage said main tuning shaft from said channel selector shaft upon movement of said main tuning shaft to either of said fixed positions.

8. In a television tuner, a hollow channel selector shaft, a main tuning shaft movable between two fixed positions, means for driving said main tuning shaft at a substantially reduced ratio from said channel selector shaft, clutch means included in said driving means for interconnecting said shafts for effectively disengaging said shafts upon movement of said main tuning shaft to either of said fixed positions, and means for driving said main tuning shaft at substantially direct ratio from said channel selector shaft and including releasable detent means interconnecting said shafts for effectively disengaging said shafts upon movement of said main tuning shaft to either of said fixed positions.

9. In a television tuner of claim 4 wherein said releasable coupling ring comprises a generally elliptical configuration provided with an outwardly extending drive lug and an inwardly extending drive lug.

10. In a television tuner of claim 5 wherein said cooperating detent means comprises a releasable coupling ring of generally elliptical configuration having an outwardly extending drive lug and an inwardly extending drive lug, and means defining a plurality of apertures disposed on the peripheral surface of said channel selector shaft for cooperating with said inwardly extending drive lug.

References Cited in the file of this patent

UNITED STATES PATENTS

| | | |
|---|---|---|
| 2,161,183 | Mastney | June 6, 1939 |
| 2,334,724 | Paessler | Nov. 23, 1943 |
| 2,378,941 | May | June 26, 1945 |
| 2,444,840 | May | July 6, 1948 |
| 2,491,341 | Tillman | Dec. 13, 1949 |
| 2,496,455 | Elliot | Feb. 7, 1950 |
| 2,824,957 | Meadows et al. | Feb. 25, 1958 |

FOREIGN PATENTS

| | | |
|---|---|---|
| 609,651 | Great Britain | Oct. 5, 1948 |